United States Patent
Lin

(10) Patent No.: US 10,692,822 B2
(45) Date of Patent: Jun. 23, 2020

(54) ZERO CAPACITANCE ELECTROSTATIC DISCHARGE DEVICE

(71) Applicant: TEXAS INSTRUMENTS INCORPORATED, Dallas, TX (US)

(72) Inventor: He Lin, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/372,117

(22) Filed: Apr. 1, 2019

(65) Prior Publication Data

US 2019/0229074 A1 Jul. 25, 2019

Related U.S. Application Data

(62) Division of application No. 15/805,897, filed on Nov. 7, 2017, now Pat. No. 10,312,202.

(51) Int. Cl.
| | |
|---|---|
| *H01L 29/861* | (2006.01) |
| *H01L 29/15* | (2006.01) |
| *H01L 27/02* | (2006.01) |
| *H01L 29/868* | (2006.01) |
| *H01L 23/60* | (2006.01) |

(52) U.S. Cl.
CPC .......... *H01L 23/60* (2013.01); *H01L 27/0255* (2013.01); *H01L 29/15* (2013.01); *H01L 29/157* (2013.01); *H01L 29/861* (2013.01); *H01L 29/868* (2013.01)

(58) Field of Classification Search
CPC ... H01L 23/60; H01L 29/868; H01L 27/0255; H01L 29/15
See application file for complete search history.

(56) References Cited

U.S. PATENT DOCUMENTS

| | | | |
|---|---|---|---|
| 7,666,751 B2 * | 2/2010 | Marreiro | H01L 27/0814 257/603 |
| 2010/0090306 A1 | 4/2010 | Salih et al. | |
| 2011/0210337 A1 * | 9/2011 | Briere | H01L 21/8258 257/76 |
| 2011/0212595 A1 | 9/2011 | Hu et al. | |
| 2012/0080769 A1 | 4/2012 | Sharma et al. | |
| 2012/0091504 A1 | 4/2012 | Davis et al. | |
| 2015/0084162 A1 | 3/2015 | Davis | |
| 2016/0300827 A1 | 10/2016 | Vendt et al. | |

* cited by examiner

*Primary Examiner* — Sonya D. McCall-Shepard
(74) *Attorney, Agent, or Firm* — Rose Alyssa Keagy; Charles A. Brill; Frank D. Cimino

(57) ABSTRACT

In some examples, an electrostatic discharge (ESD) device includes a substrate layer, a transition layer positioned on the substrate layer, a plurality of superlattice layers on the transition layer and including at least two doped superlattice layers. The ESD device further includes a plurality of doped contact structures extending from the transition layer to a surface of an outermost layer of the plurality of superlattice layers, where a first of the plurality of doped contact structures comprises an anode and a second of the plurality of doped contact structures comprises a cathode, where the plurality of doped contact structures are to generate a zero capacitance ESD device.

17 Claims, 5 Drawing Sheets

ZERO CAPACITANCE ELECTROSTATIC DISCHARGE DEVICE

REFERENCE TO RELATED APPLICATION

This Application is a Divisional of and claims priority to U.S. patent application Ser. No. 15/805,897 filed on Nov. 7, 2017, the entirety of which is hereby incorporated by reference.

BACKGROUND

Modern day electronics extensively use sub-micron scale semiconductor integrated circuits (ICs). An IC includes an input/output (I/O) interface which enables it to interact with other systems (or ICs). The I/O interface exposes the IC to static charge inputs which can cause a sudden flow of high charge (current) in the IC.

SUMMARY

According to an example, an electrostatic discharge (ESD) device includes a substrate layer, a transition layer positioned on the substrate layer, a plurality of superlattice layers on the transition layer and including at least two doped superlattice layers. The ESD device further includes a plurality of doped contact structures extending from the transition layer to a surface of an outermost layer of the plurality of superlattice layers, where a first of the plurality of doped contact structures comprises an anode and a second of the plurality of doped contact structures comprises a cathode, where the plurality of doped contact structures are to generate a zero capacitance ESD device.

According to another example, an electrostatic discharge (ESD) device includes a substrate layer, a transition layer positioned on the substrate layer, a plurality of superlattice layers stacked on the transition layer and including at least a p-doped superlattice layer, an n-doped superlattice layer and an intrinsic superlattice layer. The ESD device further includes a first doped contact structure and a second doped contact structure, both of which extend from the transition layer to a surface of an outermost layer of the plurality of superlattice layers, wherein both of the doped contact structures are to receive a threshold voltage to generate a zero capacitance ESD device.

According to yet another example, a method of fabricating an electrostatic discharge (ESD) device includes providing a substrate layer. The method further includes depositing a transition layer on the substrate layer. The method also includes growing a first intrinsic superlattice layer on the transition layer. The method further includes growing a first-doped superlattice layer on the first intrinsic superlattice layer. The method includes growing a second intrinsic superlattice layer on the first-doped superlattice layer. The method also includes growing a second-doped superlattice layer on the second intrinsic superlattice layer, wherein the second-doped superlattice layer has an outer surface. Then the method includes implanting a first contact structure extending from the outer surface of the second-doped superlattice layer to the transition layer. Further, the method includes implanting a second contact structure extending from the outer surface of the second-doped superlattice layer to the transition layer, wherein the first contact structure and the second contact structure are to receive a threshold voltage to generate a zero capacitance ESD device.

BRIEF DESCRIPTION OF THE DRAWINGS

For a detailed description of various examples, reference will now be made to the accompanying drawings in which.

DETAILED DESCRIPTION

Figure 1:
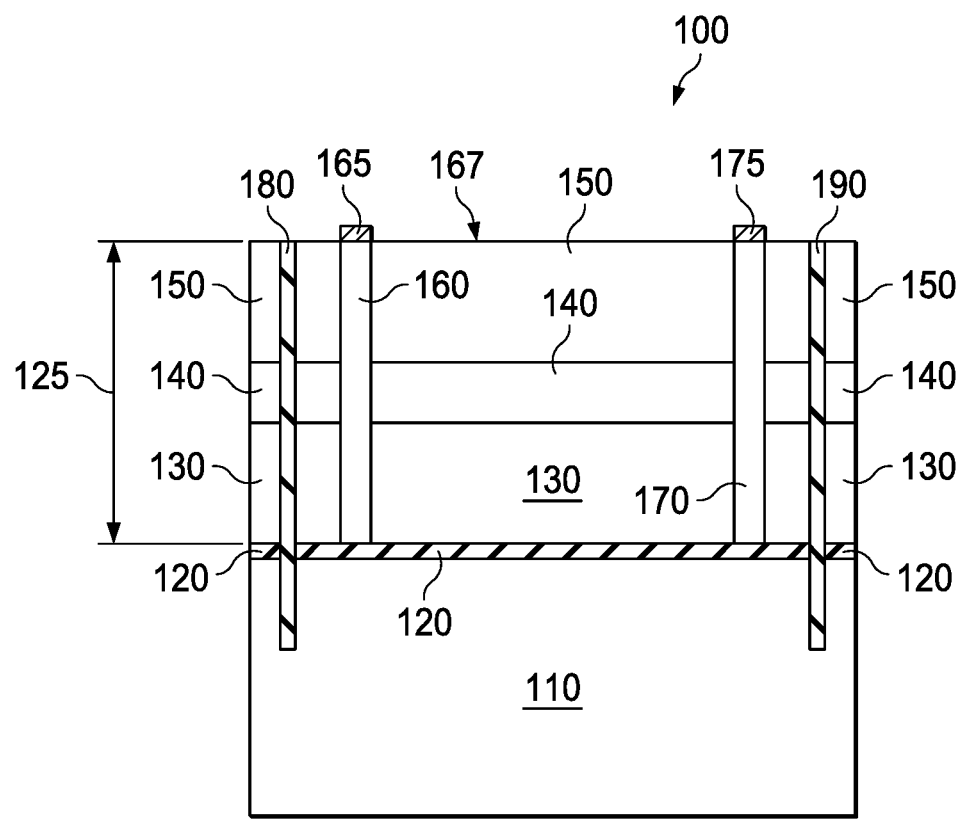
FIG. 1 is a cross sectional-view of an illustrative superlattice electrostatic discharge (ESD) device, in accordance with various examples.

An electrostatic discharge (ESD) event is a sudden flow of high current between two electrically charged objects due to a potential difference between the two objects. For example, a user (e.g., a human) may cause an ESD event in an electronic device by coming into electrical contact with the electronic device. In some cases, a charged-device model is used to characterize the susceptibility of an electronic device to damage from an ESD event. In some cases, engineers employ a range of techniques to strengthen the protection system of an IC against an ESD event. One such technique includes using diodes at the I/O interface. When the ESD event occurs, the diode junction breaks down in sub-nanosecond response time and shunts the ESD current away from the IC, thus protecting the IC from the ESD event. However, the complexity of protecting an IC from an ESD event increases with an increase in its operating frequency.

The diodes employed to protect an IC from an ESD event can function in either a forward bias or a reverse bias. The discussion herein is directed toward a diode functioning in a reverse bias. This diode is herein referred to as a "reverse-biased diode," the mode in which this diode functions is referred to as "reverse-bias mode," and the voltage applied to this diode is referred to as "reverse-biased voltage." Typically, very little current flows through a reverse-biased diode, and so a reverse-biased diode is generally approximated to an open circuit (i.e., zero flow of current). However, when the reverse-biased voltage is increased, the diode behaves differently.

As the reverse-biased voltage is increased, a "threshold" point is reached (commonly referred to as "breakdown voltage") where the reverse-biased diode experiences a dramatic reduction in dynamic resistance and an equivalent, exponential increase in current. In some cases, a reverse-biased diode can be configured to perform either as a zener diode or as an avalanche diode. The terms "zener diode" and "avalanche diode" are often used interchangeably. Both refer to the breakdown of a reverse-biased diode at a threshold voltage. An avalanche diode Involves minority carrier acceleration in the depletion region. The minority carriers are accelerated by the electric field in the depletion region to the energies sufficient to free a large number of electron-hole pairs via collision. Zener diodes are highly doped and that enables tunneling of electrons in the depletion region which relieves a large number of free charge carriers. The sudden generation of carriers rapidly increases the reverse current. The time taken by a reverse-biased diode to transform from working in the reverse-biased mode (approximating an open circuit) to working in the zener/avalanche mode is referred to as the "response-time" of a reverse-biased diode.

Conventional diodes, due to their relatively large size (e.g., tens of microns), includes 3-dimensional (3D) carriers (e.g., electron, holes). The term "3D" refers to the planes of motion in which a carrier can freely move. For example, as per the Cartesian coordinate system, a 3D carrier can move in X, Y and Z directions. Also, the 3D carriers (electrons and holes) are not spatially separated and experience coulombic force. In such a diode, the response-time is limited to nanoseconds (e.g., 0.6 ns to 1 ns) because conventional diodes form conventional depletion regions, which results in a finite junction capacitance, which further restricts the movement of the 3D carriers.

The nanosecond-scale response-times of conventional diodes are inadequate for very-high frequency systems. Modern electronic systems can run at 20 GHz and they may require a pico-second response time during an ESD event. Therefore, there is a need for an ESD protection device that can discharge ESD current generated during an ESD event within pico-seconds. Accordingly, at least some of the examples disclosed herein are directed to systems and methods for a device which is equipped to shunt high ESD current with a pico-second response-time. The disclosed systems and methods facilitate the shunting of ESD current by utilizing homogeneous/heterogeneous superlattice quantum-well structures. In particular, the disclosed examples form a zero-capacitance depletion layer and a zero-capacitance ESD device that can quickly shunt ESD current by leveraging spatially-independent carriers (two-dimensional electron (2DEG) gas and two-dimensional hole gas (2DHG)) that are readily available as they form due to polarization in superlattice quantum-well structures.

Illustrative examples include a superlattice structure ("superlattice layer") that is an ultrathin (5 nm-500 nm) layer of a semiconductor material. Typically, a superlattice is a structure of layers of two or more materials and exhibits regularity in its lattice structure. The thickness of one superlattice layer is typically several nanometers (1 nm-500 nm). A superlattice layer can include semiconductor material formed using group III-group V elements in the periodic table of elements (e.g., GaN). In some examples, the superlattice layer can include semiconductor material formed by depositing three semiconductor materials from group III-group V of the periodic table of elements (e.g., AlGaN). Depositing group III-group V material (e.g., with a narrow band-gap) with another group III-group V material (e.g., with a broader band-gap) can result in the formation of spatially-independent 2-D electron gas (2DEG) and 2-D hole gas (2DHG), both of which have high carrier density and mobility.

Illustrative examples may also include the superlattice layers that can be doped with either a p-type (acceptor) dopant or an n-type (donor) dopant. Doping the superlattice layer results—depending on the dopant used—in either an n-doped superlattice layer or a p-doped superlattice layer. An un-doped superlattice layer, in some cases, is referred to as an intrinsic superlattice layer.

FIG. 1 is a cross sectional-view of an illustrative superlattice ESD device 100. The superlattice ESD device 100 includes a substrate 110, a transition layer 120, and a plurality of superlattice layers 125 (e.g., a first superlattice layer 130, a second superlattice layer 140, and a third superlattice layer 150). The superlattice ESD device 100 further includes a first doped contact structure 160, a second doped contact structure 170, a first contact metal 165 positioned on the first contact structure 160, a second contact metal 175 positioned on the second contact structure 170, a first isolation trench structure 180 and a second isolation trench structure 190.

The substrate 110 may include silicon. In some examples, the substrate 110 can include other elements (e.g., elements from column IV of the periodic table of elements as well as combinations of elements from columns III-V). In some examples, the substrate 110 includes high resistivity silicon. The transition layer 120 may act as a "stage" on which the superlattice layers are grown. Because growing superlattice layers 125 on the substrate 110 may result in random nucleation and selective growth, the transition layer 120 is employed to facilitate the growth of high-quality superlattice layers 125. Additionally, the transition layer 120 is used because it has less lattice mismatch with the superlattice layers 125, thus providing a more regular superlattice structure. The transition layer 120 may be 500 Å-1000 Å thick. In some examples, the transition layer 120 may include aluminum nitride, silicon carbide, gallium nitride, etc. In some examples, a thick transition layer including aluminum nitride, silicon carbide, gallium nitride etc. For example, a 3000 Å gallium nitride layer may be used on a silicon substrate as the transition layer 120.

The first doped contact structure 160 and the second doped contact structure 170 can be doped with high concentrations of complementary dopants. For example, the first doped contact structure 160 can be highly doped with n-type dopants (e.g., 1×10E18 cc) and similarly, the second doped contact structure 170 can be highly doped with p-type dopants (e.g., 1×10E18 cc). In other examples, the first doped contact structure 160 can be highly doped with p-type dopants (e.g., 1×10E18 cc) and the second doped contact structure 170 can be highly doped with n-type dopants (e.g., 1×10E18 cc). The doped contact structures 160, 170 extend from an outer surface 167 of a plurality of superlattice layers 125 to the transition layer 120.

The doped contact structures 160, 170 are configured to receive an electric charge during an ESD event through the contact metals 165, 175 such that the n-doped contact metal receives a positive charge and the p-doped contact metal receives a negative charge. FIG. 1 also depicts the first isolation trench structure 180 and the second isolation trench structure 190 creating an Isolation boundary for superlattice ESD device 100. Isolation trench layers are typically used to "insulate" one ESD device from another ESD device (that may be positioned adjacent to the other ESD device) in order to prevent short circuit between the two ESD devices. Typically, an isolation trench layer is fabricated by etching the superlattice layers 125 and then depositing one or more dielectric materials, such as silicon dioxide, etc. In some examples, a scribe seal structure may be used to insulate two or more ESD devices. The type of Insulation employed may depend on the application of the ESD device.

As described above, the plurality of superlattice layers 125 can include elements from groups III-V of the periodic table (e.g., GaAs, GaN, etc.) and in some examples, the plurality of superlattice layers 125 can include multiple superlattice layers including amalgamated compounds grown using group III-V elements (e.g., AlGaN). As mentioned above, FIG. 1 depicts the plurality of superlattice layers 125 that includes three superlattice layers 130, 140 and 150. In some examples, the number of superlattice layers in the plurality of superlattice layers 125 can vary (e.g., can be more or less than three) and may not be present in the same number as depicted in FIG. 1.

The number of superlattice layers in the plurality of superlattice layers 125 and the type of superlattice layers (e.g., n-type superlattice layer, p-type superlattice layer or intrinsic superlattice layer) to be employed in the ESD superlattice device 100 depends on the amount of current to be shunted by the ESD superlattice device 100. In some examples, the number of superlattice layers also depends on the desired response-time. For example, an application which may result in a low ESD current may require a low number (e.g., two) of superlattice layers and an application which may have to shunt a high ESD current may require a large number (depending on the ESD current and the response time) of different types of superlattice layers.

Still referring to the plurality of superlattice layers 125, in the discussion below, "p" refers to a p-doped superlattice layer, "n" refers to an n-doped superlattice layer, and "i" refers to an intrinsic superlattice layer. In some examples, an intrinsic superlattice layer may be positioned between two differently doped superlattice layers—such as, p-i-n-i-p-i- . . . or i-p-n-i-p-i-n- and such superlattice layers can include the plurality of superlattice layers 125. They are commonly referred to as doping superlattice layers. The aforementioned sequence of layers can form the plurality of superlattice layers 125. FIG. 2(a)-FIG. 2(f) shows examples of such doping superlattice layers.

Similarly, in other examples of the plurality of superlattice layers 125, differently doped superlattice layers can be alternatively placed over each other. Such superlattice layers 125 are commonly known as compositional superlattice layers. For example, a plurality of differently doped superlattice layers, such as n-p-n-p-n-p-n-p- . . . may form the plurality of superlattice layers 125. FIG. 3(a)-FIG. 3(d) show examples of compositional superlattice layers of the plurality of superlattice layers 125. As noted above, the number of alternating, differently doped superlattice layers can vary based on the ESD current to be discharged and the target response time. In addition to the differently doped superlattice layers stacked on each other, in some examples, an intrinsic superlattice layer can either be positioned on the transition layer 120 or positioned opposite to the transition layer 120.

Figure 2A:
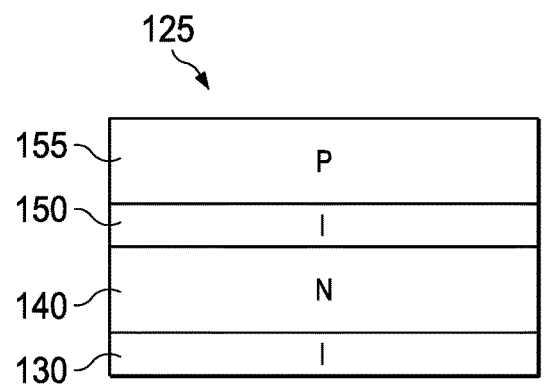
FIGS. 2(a)-2(f) depicts examples of a plurality of superlattice layers.
Figure 2D:
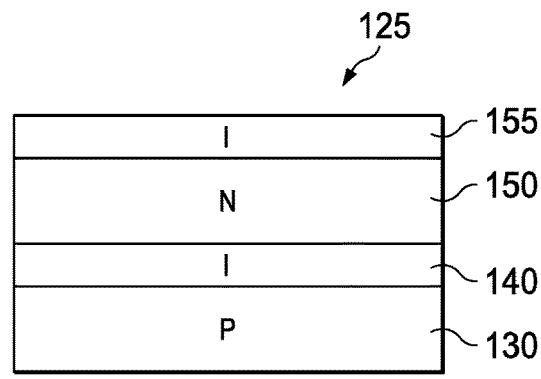
Figure 2B:
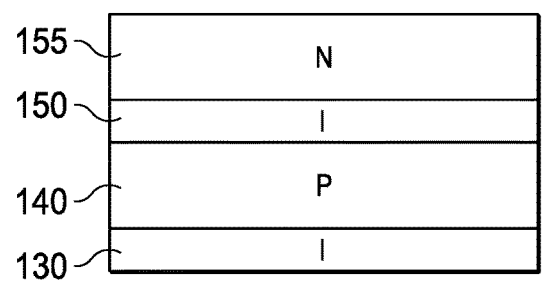
Figure 2E:
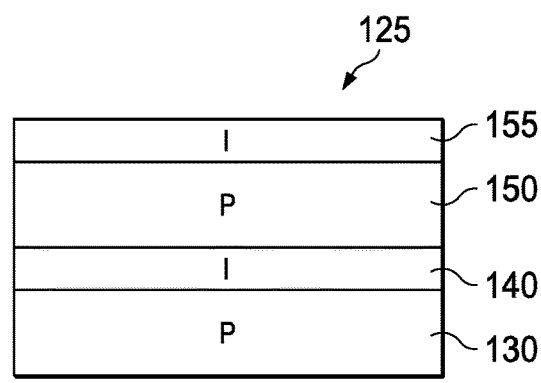
Figure 2C:
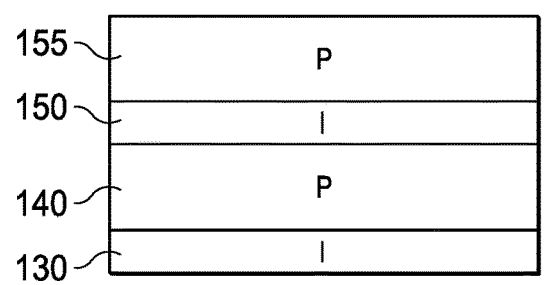
Figure 2F:
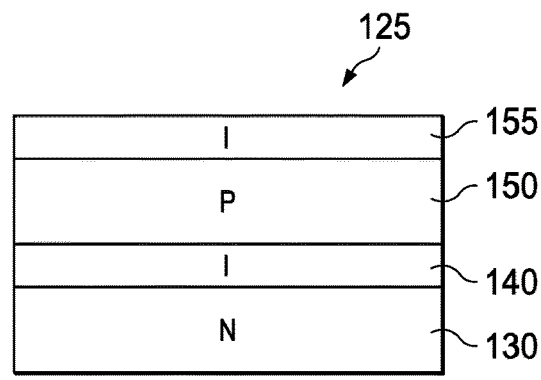
Figure 3A:
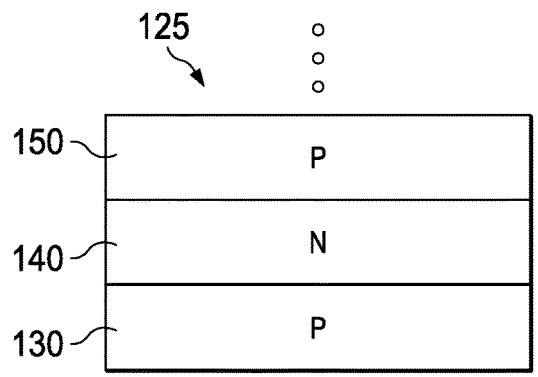
FIG. 3(a)-3(d) depicts examples of a plurality of superlattice layers.
Figure 3B:
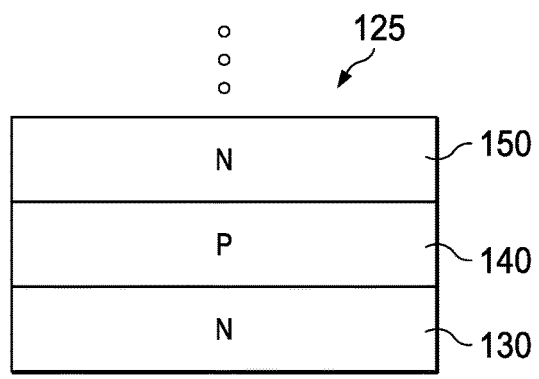
Figure 3C:
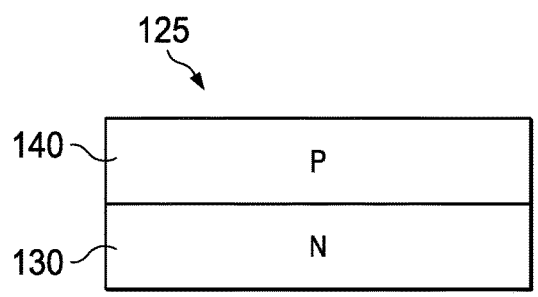

The examples shown in FIG. 2(a)-FIG. 2(f) and FIG. 3(a)-FIG. 3(d) include different numbers of individual superlattice layers than the number of individual superlattice layers depicted in FIG. 1. Regardless of the number of superlattice layers used, the outer surface of the ESD superlattice device 100 may be referred to as the outer surface of the topmost superlattice layer (e.g., FIG. 2(a), superlattice layer 155; FIG. 3(c), superlattice layer 140) of the plurality of superlattice layers 125. Similarly, regardless of the number of superlattice layers used, the doped contact structures 160, 170 and the trench isolation layers 180, 190, extend from the outer surface of the topmost layer of the superlattice layers 125.

The superlattice layers 125 are not limited to the specific examples shown in the aforementioned figures. All of the examples shown in the aforementioned figures can be configured, as described below, to form a depletion region which is depleted of charge at a voltage that equal or in some examples, less than the threshold voltage. The examples shown are also configured to cause a depletion of charges from the ESD superlattice device 100 at a threshold voltage, which generates an ESD superlattice device 100 with zero-capacitance. In some examples, the capacitance of the ESD superlattice device 100 at the threshold value is absolute zero. In other examples, some stray capacitance, ranging between 0.01 femtofarads to 5 femtofarads (inclusive), due to packaging or due to the presence of routing layers may exist. Thus, the terms "zero capacitance" and "substantially zero capacitance" are used interchangeably herein to refer to a capacitance ranging from 0.00 farads (i.e., absolute zero) to 5 femtofarads. All the examples shown are also configured to generate spatially independent 2DEG/2DHG which can discharge an ESD current generated during an ESD event. The examples shown in FIG. 2(a)-FIG. 2(f) and FIG. 3(a)-FIG. 3(d) merely depict the possible arrangement of superlattice layers which can form the plurality of superlattice layers 125. In other examples, more superlattice layers—both differently doped and/or intrinsic superlattice layer—can be used to create a different sequence of the superlattice layers 125.

Figure 3D:
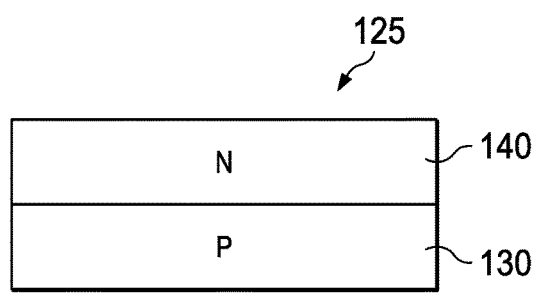

Referring back to FIG. 1, in some examples, the minimum number of superlattice layers needed to fabricate the ESD superlattice device 100 is two. In such an example, the plurality of superlattice layers 125 will include two complementary doped layers, such as p-doped superlattice layer 130 and n-doped superlattice layer 140 or n-doped superlattice layer 130 or p-doped superlattice layer 140, as shown in FIG. 3(c)-FIG. 3(d). In such examples, quantum effects become apparent. For instance, the excess electrons and holes do not form spatially dependent plasma (or gas), but form a spatially independent plasma. This is because the repulsive electrostatic potential between carriers with the same charge (electrons-electrons and holes-holes) strongly exceeds the attractive interaction between carriers with an opposite charge (electrons-holes). This results in an enhanced ambipolar diffusion of electrons and holes that makes the diffusion constant in the n-p superlattice layer significantly higher than the diffusion constant of the conventional p-n junction. Stated another way, the diffusion constant is significantly high owing to the spatially separated electrons and holes, whereas the spatial dependence in a conventional p-n junction results in significantly lower diffusion constant (e.g., by two orders of magnitude relative to the diffusion constant of n-p superlattice layers).

In operation, when a reverse-biased voltage is applied to the ESD device 100 with the plurality of superlattice layers 125 as depicted in FIGS. 3(c) and 3(d), it forms a depletion layer at the junction of the superlattice layer 130 and the superlattice layer 140. As the reverse-biased voltage is increased, the depletion region expands spatially in both the superlattice layer 130 and 140. Owing to the ultrathin structure of the superlattice layers, both the superlattice layers 130 and 140 will start depleting charge (i.e., the net charge in the spatially increasing depletion layer will limit to zero) at some reverse-biased voltage. As the reverse-biased voltage is Increased up to a threshold voltage, all the charge in the ESD device 100 is depleted, thus resulting in a zero capacitance of the ESD device 100. From a charge and voltage perspective, as the reverse-biased voltage is increased, the differential change of charge per unit change of reverse-biased voltage (dq/dV) limits to zero, thus, resulting in a zero-capacitance ESD device that works in the depletion mode. In other words, when the reverse-biased voltage is increased up to a threshold voltage, all the charge in the superlattice layers 130 and 140 will be depleted, and no charge flows in the quantum-well structures, and this result in a zero-capacitance ESD device (or a zero-capacitance structure).

In particular, during an ESD event, the ESD device 100, due to the zero capacitance of the ESD device, transforms from a reverse-biased mode (open circuit) to an avalanche mode in pico-seconds. The ESD current generated during the ESD event flows horizontally through the 2DEG/2DHG as a high number of free electrons and holes is present in the superlattice layers to discharge the ESD current.

As noted above, the number of layers present in the plurality of superlattice layers 125 depends on an application in which the ESD superlattice device 100 may be employed. For higher power systems where a user may anticipate an ESD event generating high current, more layers (than the two discussed above) can be used. The principle of zero-capacitance ESD device at a threshold voltage and the flow of ESD current during an ESD event will remain the same in all such examples. For example, see FIGS. 3(a) and 3(b). An increasing number of superlattice layers with proper doping level can tune the threshold voltage. In some examples, an increased threshold voltage can be achieved by increasing the thickness of the superlattice layers.

Referring back to FIG. 1, the examples disclosed herein may Include doped superlattice layers. In some examples, the minimum number of superlattice layers needed to fabricate an ESD superlattice device 100 using a doping superlattice layer is three. For example, in the case of doping superlattice layers, the superlattice layer 150 of FIG. 1 can either be a p-doped superlattice layer or an n-doped superlattice layer. Complementary to the doping of the superlattice layer 150, the superlattice layer 130 can be either n-doped or p-doped. In this example, however, the superlattice layer 140 is the intrinsic superlattice layer. The presence of an intrinsic superlattice layer provides various advantages to the ESD superlattice device 100. For example, presence of an intrinsic layer provides the ability to tune the carrier density, bandgap, sub-band structure and recombination lifetime of the carriers. In some examples, the intrinsic layer can be used to increase the threshold voltage of the ESD superlattice device 100.

As noted above, the excess electrons and holes do not form spatially dependent plasma (or gas), but they do form a spatially independent plasma in the ESD superlattice device 100. This results in enhanced "ambipolar" diffusion of electrons and holes and the diffusion constant in the n-i-p superlattice layer is higher than the diffusion constant of the conventional p-n junction diode. In operation, when a reverse-biased voltage is applied to the ESD superlattice device 100 using the contact metals 165 and 175, a depletion layer extends to the intrinsic superlattice layer 140 and to both the doped superlattice layers positioned above (150) and below (130) the superlattice layer 140. As the reverse-biased voltage is increased, the depletion layer, owing to the ultrathin thickness of the superlattice layers, extends to both the superlattice layers 130 and 150. The change of charge per unit change of reverse bias (dq/dV) tends to approach zero, thus resulting in a zero-capacitance ESD device. During an ESD event, the ESD device 100, due to the zero capacitance of the depletion layer (and the ESD device), transitions from a reverse bias mode to an avalanche mode in pico-seconds. The ESD current generated during the ESD event flows horizontally through the 2DEG/2DHG.

For the doping superlattice layer example discussed above, the number of superlattice layers 125 depends on the application. For higher power systems in which a user may anticipate an ESD event generating high current, more layers (i.e., more than the three discussed above) can be used. The principle of zero-capacitance ESD device at a threshold voltage and the flow of ESD current during an ESD event will remain the same in all such examples. For example, see FIG. 2(a)-2(f). An increasing number of superlattice layers with adjusted doping levels can increase the threshold voltage. In some examples, an increased threshold voltage can be achieved by increasing the thickness of the superlattice layers.

Figure 4A:
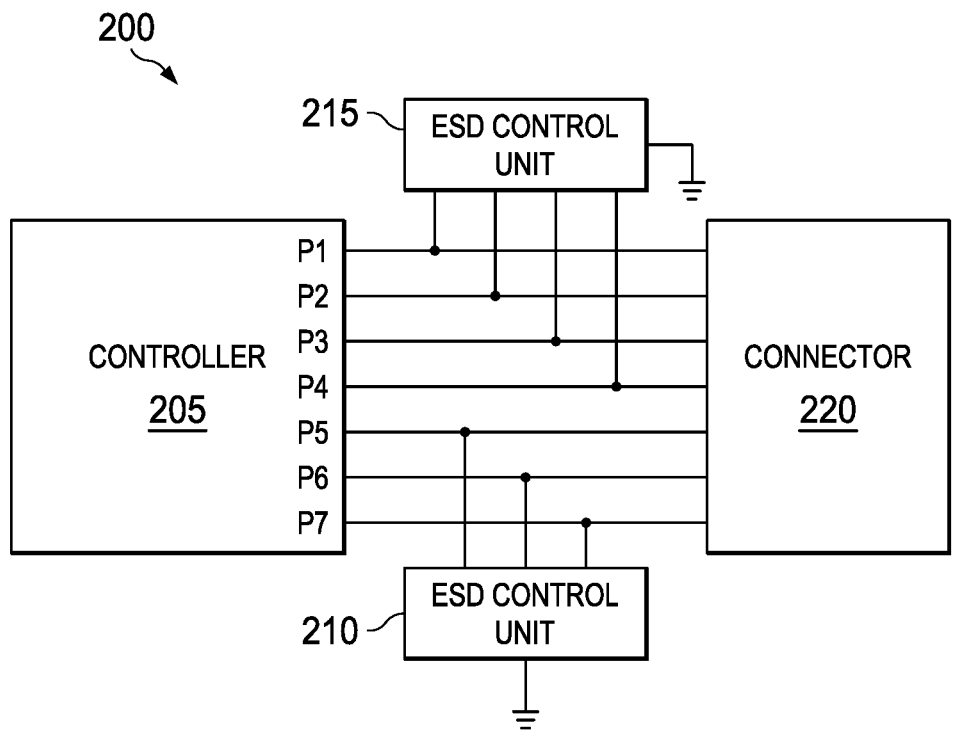
FIG. 4(a) depicts a simplified schematic diagram showing an Illustrative implementation of an ESD control unit in a system.

FIG. 4(a) depicts a simplified schematic diagram showing an illustrative implementation of the ESD control units 210, 215 in an illustrative system 200. The system 200 may include a controller 205 and a connector 220. In some examples, the controller 205 may also include multiple ports, such as ports p1, p2, p3, p4, p5, p6, and p7, which may facilitate electrical coupling between the connector 220 and the controller 205. As noted above, these ports (or interfaces) are prone to introduce ESD events; therefore, in order to prevent the ESD events, the ESD control units 210, 215 are coupled to these ports. The controller 205, in this example, includes 7 ports. In other examples, the number of ports may differ. The ESD control unit 210 and the ESD control unit 215 may couple to a different set of ports, for example, the ESD control unit 210 may couple to the ports p5, p6, p7, and the ESD control unit 215 may couple to the ports p1, p2, p3, and p4. FIG. 4(a) depicts two ESD controllers 210, 215. In some examples, a single ESD controller which connects to all the ports may be used. In some examples, depending on the potential difference generated during an ESD event, the ESD control units 210, 215 may include one or more ESD devices 100.

In operation, when the controller 205 experiences an ESD event (due to some static charge introduced by human activity, for instance), a potential difference is introduced to one or more ports p1, p2, p3, p4, p5, p6, and p7. For instance, assume that the potential difference is experienced at the port p1. Further assume that the contact structure 160 (FIG. 1) is doped with p-type dopants, the contact structure 170 (FIG. 1) Is doped with n-type dopants, and the connection in the ESD control unit 215 may be such that the contact structure 160 is coupled to the ground and the contact structure 170 is configured to receive the potential difference experienced at the port p1. When some potential difference is experienced at the port p1, the ESD device 100 receiving the potential at contact structure 170 enables the ESD device 100 to generate a zero-capacitance in the ESD device 100 by depleting all the charges that discharge the ESD current generated during the ESD event through the 2DEG within pico-seconds.

Figure 4B:
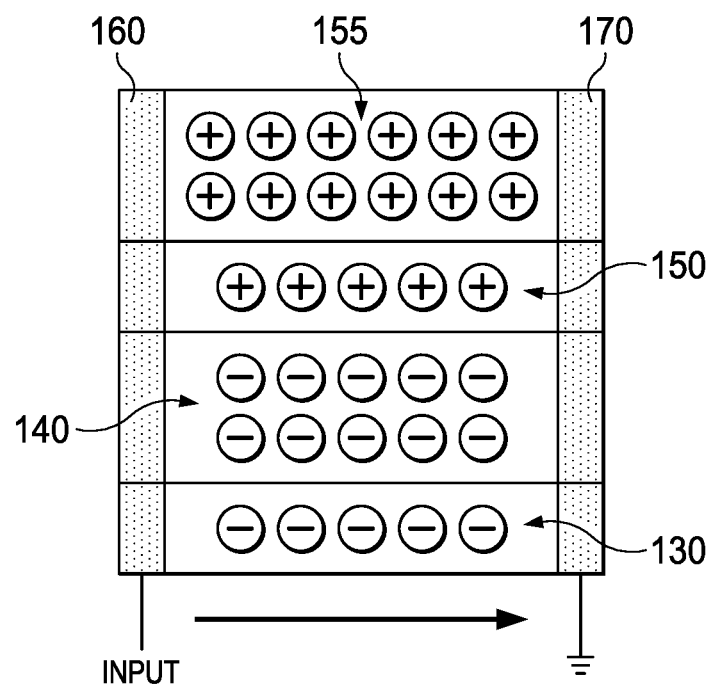
FIG. 4(b) depicts the flow of an illustrative 2DEG/2DHG during operation.
Figure 5:
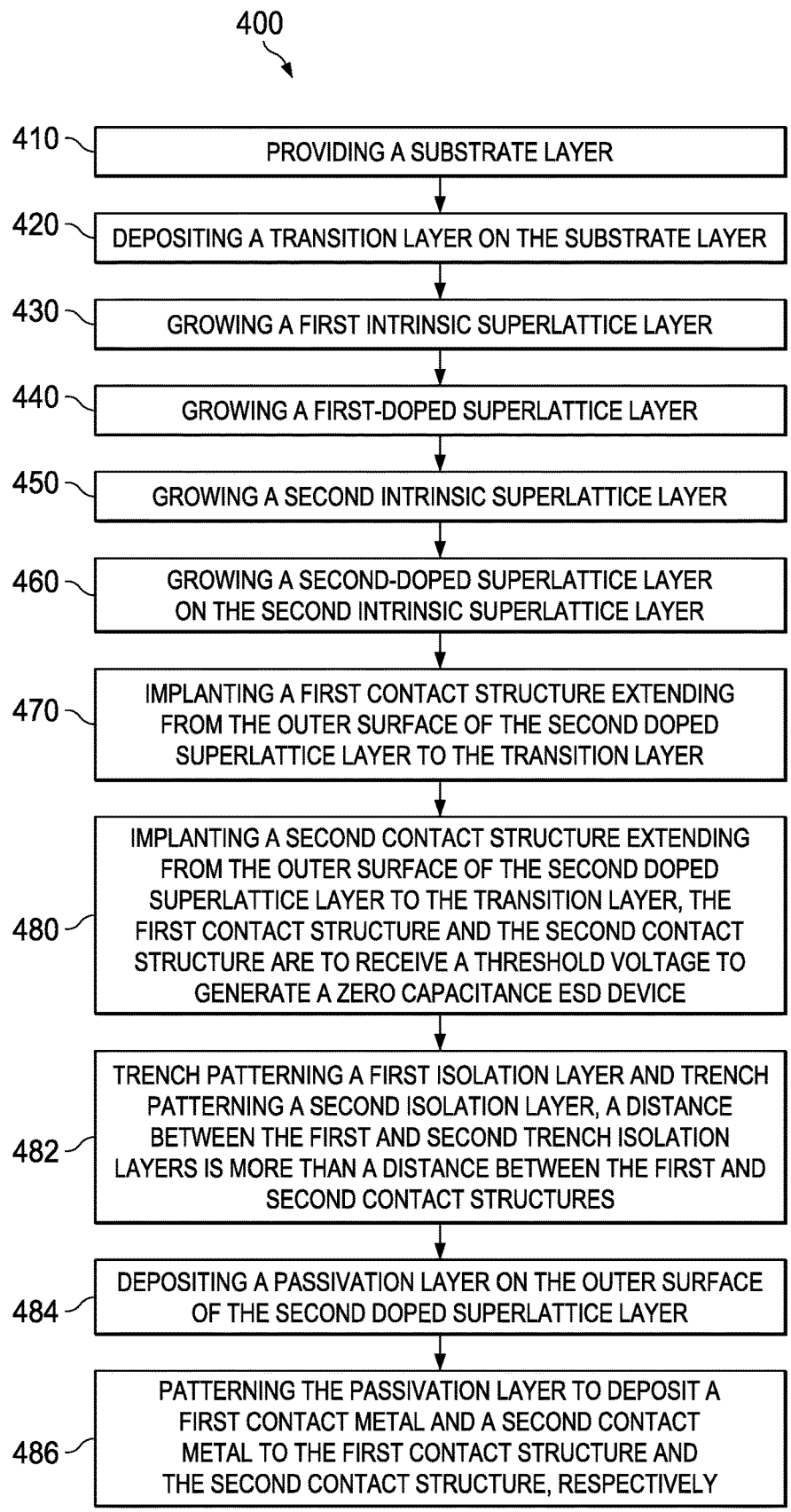
FIG. 5 depicts an illustrative method to fabricate a superlattice ESD device, in accordance with various examples.

FIG. 4(b) depicts an illustrative flow of 2DEG/2DHG during operation in the context of the embodiment depicted in FIG. 2(b) (i.e., the superlattice layer 155 is doped with n-type dopants, the superlattice layers 140 is doped with p-type dopants, and the superlattice layers 150, 130 are intrinsic layers, i.e., they are not doped). FIG. 4(b) further depicts the first contact structure 160 that is heavily doped with n-type dopants and the second contact structure 170 that is heavily doped with p-type dopants. The first contact structure 160 is configured to receive the potential (or some derivative of the potential) introduced through one or more ports (p1, p2, p3, p4, p5, p6, and p7) and the second contact structure 170 is coupled to the ground. As the potential is introduced, the charges inside the ESD device are depleted (not expressly shown) and the ESD current generated during the ESD event is discharged through the 2DEG/2DHG, as shown in FIG. 4(b), within pico-seconds. This description is illustrative of the operation of the embodiment depicted in FIG. 2(b). Similar principles of operation apply to the operation of other embodiments, such as those depicted in FIGS. 2(a), 2(c)-2(f), and 3(a)-3(d). Referring now to FIG. 5. FIG. 5 depicts an illustrative method 400 to fabricate an ESD superlattice device 100 (FIG. 1) using the plurality of superlattice layers 125 described in FIG. 2(a). The method 400 is now described in tandem with FIG. 1 and FIG. 2(a). Step 410 includes providing a substrate layer 110. The substrate layer 110 can include silicon. In some examples, the substrate layer 110 includes high resistivity silicon as this material is preferable for fabricating high frequency application devices. In some examples, the substrate layer 110 can include gallium nitride, aluminum nitride, silicon carbide, or other group III-V elements. The method 400 continues in step 420 with depositing a transition layer 120 on the substrate layer 110. In some examples, the transition layer 120 can be a thin layer (e.g., 500 Å-1000 Å) which can Include aluminum nitride, silicon carbide, gallium nitride, or other group III-V semiconductors. The transition layer 120 is typically used in the superlattice ESD device 100 to provide a "stage" for the plurality of superlattice layers 125 to grow. In such an example, the transition layer's thickness can be between 50 nm to 500 nm.

As noted above, the plurality of superlattice layers 125 can include different types of superlattice layers. For example, the plurality of superlattice layers 125 may include doped superlattice layers. In some examples, a Ga(X) Al(Y) N layer may be used as an intrinsic superlattice layer and can also be doped with a relevant dopant to form a p-type superlattice layer or an n-type superlattice layer. In other examples, superlattice layers grown using other elements from group III-V elements or amalgamated group III-V elements with different band-gaps can be used. For instance, superlattice layers can include GaN, aluminum nitride ("AlN"), or an amalgamation of these two forming aluminum gallium nitride ("AlGaN"). Other examples may include superlattice layers including GaAs, GaAlN, etc.

The method 400 continues in step 430 with growing a first intrinsic superlattice layer 130. In some examples, the first intrinsic superlattice layer 130 can be a Ga(X) Al(Y) N heterostructure layer, where "X" and "Y" depict the percentage of the respective compound in the heterostructure layer. In some examples, the thickness of the first intrinsic layer 130 is 10 nm-100 nm, inclusive. The Ga(X) Al(Y) N heterostructure layer can be grown using metal-organic chemical vapor deposition (MOCVD), atomic layer deposition (ALD), epitaxy, etc. The method 400 continues in step 440 with growing a first-doped superlattice layer 140 having a thickness between 30 nm-500 nm, inclusive. In some examples, the first-doped superlattice layer 140 can either be an n-type superlattice layer or a p-type superlattice layer. The growth of the first-doped superlattice layer 140 may be divided into two steps, which include growing the intrinsic heterostructure layer of Ga(X)Al(Y)N using either of the Ga(0.7)Al(0.3)N layer or Ga(0.3)Al(0.7)N and then implanting the aforementioned intrinsic layer with either type of dopant (e.g., Mg for p-type or Si for n-type). Implanting the intrinsic superlattice layer with the dopant results in the first-doped superlattice layer 140. In some examples, the doping level is approximately 6E16 cc.

The method 400 continues in step 450 with growing a second intrinsic superlattice layer 150. In some examples, the second intrinsic superlattice layer 130 can be a Ga(X) Al(Y) N heterostructure layer. In some examples, the thickness of the first intrinsic layer 130 is 10 nm-100 nm, inclusive. The Ga(X) Al(Y) N heterostructure layer can be grown using metal-organic chemical vapor deposition (MOCVD), atomic layer deposition (ALD), epitaxy, etc. The method 400 continues in step 460 with growing a second-doped superlattice layer 155 of thickness between 30 nm-500 nm, inclusive. In some examples, the second-doped superlattice layer 155 can either be an n-type superlattice layer or a p-type superlattice layer (depending on the first-doped superlattice layer). The growth of the second-doped superlattice layer 155 is typically divided into two steps, which include growing the intrinsic heterostructure layer of Ga(X) Al(Y) N using either of the Ga(0.7) Al(0.3) N layer or Ga(0.3) Al(0.7) N and then implanting the aforementioned intrinsic layer with either type of dopant (e.g., Mg for p-type or Si for n-type). Implanting the intrinsic superlattice layer with the dopant results in the second-doped superlattice layer 140. In some examples, the doping level is approximately 6E16 cc.

The method 400 continues in step 470 with implanting a first contact layer. The first contact structure 160 can be patterned and implanted using a mask and ion implantation technique. In some examples, the first contact structure 160 can be implanted using n-type dopants or p-type dopants. The method 400 further continues in step 480 with implanting a second contact structure 170 using another mask and ion implantation technique. In some examples, the second contact structure 170 can be implanted using n-type dopants or p-type dopants (e.g., complementary to the dopants used in the first contact layer).

In some examples, the method 400 can further continue with trench-patterning a first isolation structure 180 and a second isolation structure 190 (step 482). In some examples, a shallow trench isolation technique can be used to form the first isolation structure 180 and the second isolation structure 190. Due to the ultrathin thickness of the plurality of superlattice layers 125, trench isolation layers can be formed by etching a pattern of trenches in the silicon substrate and depositing one or more dielectric materials to fill the trenches, thus providing electrical isolation from other devices. In some examples, the distance between the first isolation structure 180 and the second isolation structure 190 is more than the distance between the first contact structure 160 and the second contact structure 170.

The method 400 can further continue with depositing a passivation layer on the outer surface of the second-doped superlattice layer 155 (step 484). The passivation layer is deposited to protect the second-doped superlattice layer 155 from contaminants. Further, the method 400 can also include patterning the passivation layer to deposit a first contact metal 165 seated on the first contact structure 160 and the second contact metal contact 175 seated on the second contact structure 170 (step 486).

The above discussion is meant to be Illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. An electrostatic discharge (ESD) device, comprising:
   a substrate layer;
   a transition layer positioned on the substrate layer;
   a plurality of superlattice layers on the transition layer and including at least two doped superlattice layers; and
   a plurality of doped contact structures extending from the transition layer to a surface of an outermost layer of the plurality of superlattice layers, wherein a first of the plurality of doped contact structures comprises an anode and a second of the plurality of doped contact structures comprises a cathode, wherein the plurality of doped contact structures are to generate a zero capacitance ESD device.

2. An electrostatic discharge (ESD) device, comprising:
   a substrate layer;
   a transition layer positioned on the substrate layer;
   a plurality of superlattice layers on the transition layer and including at least two doped superlattice layers; and a plurality of doped contact structures extending from the transition layer to a surface of an outermost layer of the plurality of superlattice layers, wherein a first of the plurality of doped contact structures comprises an anode and a second of the plurality of doped contact structures comprises a cathode, wherein the plurality of doped contact structures are to generate a zero capacitance ESD device;

wherein the at least two doped superlattice layers are doped using a first dopant and a second dopant resulting in a p-type superlattice layer and an n-type superlattice layer, respectively.

3. An electrostatic discharge (ESD) device, comprising:
a substrate layer;
a transition layer positioned on the substrate layer;
a plurality of superlattice layers on the transition layer and including at least two doped superlattice layers; and
a plurality of doped contact structures extending from the transition layer to a surface of an outermost layer of the plurality of superlattice layers, wherein a first of the plurality of doped contact structures comprises an anode and a second of the plurality of doped contact structures comprises a cathode, wherein the plurality of doped contact structures are to generate a zero capacitance ESD device;
wherein the plurality of superlattice layers includes a plurality of differently doped superlattice layers.

4. An electrostatic discharge (ESD) device, comprising:
a substrate layer;
a transition layer positioned on the substrate layer;
a plurality of superlattice layers on the transition layer and including at least two doped superlattice layers; and
a plurality of doped contact structures extending from the transition layer to a surface of an outermost layer of the plurality of superlattice layers, wherein a first of the plurality of doped contact structures comprises an anode and a second of the plurality of doped contact structures comprises a cathode, wherein the plurality of doped contact structures are to generate a zero capacitance ESD device;
wherein the plurality of superlattice layers includes an intrinsic superlattice layer positioned between at least two doped superlattice layers.

5. An electrostatic discharge (ESD) device, comprising:
a substrate layer;
a transition layer positioned on the substrate layer;
a plurality of superlattice layers on the transition layer and including at least two doped superlattice layers; and
a plurality of doped contact structures extending from the transition layer to a surface of an outermost layer of the plurality of superlattice layers, wherein a first of the plurality of doped contact structures comprises an anode and a second of the plurality of doped contact structures comprises a cathode, wherein the plurality of doped contact structures are to generate a zero capacitance ESD device;
wherein the plurality of superlattice layers includes a first intrinsic superlattice layer and a second intrinsic superlattice layer, wherein the first intrinsic superlattice layer is positioned between at least two doped superlattice layers and the second intrinsic superlattice layer is positioned on the transition layer.

6. The ESD device of claim 1, further comprising a first trench isolation layer and a second trench isolation layer, both of which extend from the outermost layer of the plurality of superlattice layers to the substrate layer.

7. The ESD device of claim 6, wherein a distance between the first and the second trench isolation layers is more than a distance between the plurality of doped contact structures.

8. The ESD device of claim 1 further comprising a dielectric layer on the outermost layer of the plurality of superlattice layers, wherein the dielectric layer includes a first metal contact seated on the first of the plurality of doped contact structures and a second metal contact seated on the second of the plurality of doped contact structures.

9. An electrostatic discharge (ESD) device, comprising:
a substrate layer;
a transition layer positioned on the substrate layer;
a plurality of superlattice layers stacked on the transition layer and including at least a p-doped superlattice layer, an n-doped superlattice layer and an intrinsic superlattice layer; and
a first doped contact structure and a second doped contact structure, both of which extend from the transition layer to a surface of an outermost layer of the plurality of superlattice layers, wherein both of the doped contact structures are to receive a threshold voltage to generate a zero capacitance ESD device.

10. The ESD device of claim 9, wherein the p-doped superlattice layer is positioned on the transition layer, the intrinsic superlattice layer is positioned on the p-doped superlattice layer and the n-doped superlattice layer is positioned on the intrinsic superlattice layer.

11. The ESD device of claim 9, wherein the n-doped superlattice layer is positioned on the transition layer, the intrinsic superlattice layer is positioned on the n-doped superlattice layer and the p-doped superlattice layer is positioned on the intrinsic superlattice layer.

12. The ESD device of claim 9, wherein the n-doped superlattice layer is positioned on the transition layer, the p-doped superlattice layer is positioned on the n-doped superlattice layer and the intrinsic superlattice layer is positioned on the p-doped superlattice layer.

13. The ESD device of claim 9, wherein the p-doped superlattice layer is positioned on the transition layer, the n-doped superlattice layer is positioned on the p-doped superlattice layer and the intrinsic superlattice layer is positioned on the n-doped superlattice layer.

14. The ESD device of claim 1, wherein the at least two doped superlattice layers are doped using a first dopant and a second dopant resulting in a p-type superlattice layer and an n-type superlattice layer, respectively.

15. The ESD device of claim 1, wherein the plurality of superlattice layers includes a plurality of differently doped superlattice layers.

16. The ESD device of claim 1, wherein the plurality of superlattice layers includes an intrinsic superlattice layer positioned between the at least two doped superlattice layers.

17. The ESD device of claim 1, wherein the plurality of superlattice layers includes a first intrinsic superlattice layer and a second intrinsic superlattice layer, wherein the first intrinsic superlattice layer is positioned between the at least two doped superlattice layers and the second intrinsic superlattice layer is positioned on the transition layer.

* * * * *